United States Patent
Reiche

(10) Patent No.: US 9,596,389 B2
(45) Date of Patent: Mar. 14, 2017

(54) METHOD FOR MANUFACTURING AN IMAGER MODULE AND A CORRESPONDING IMAGER MODULE

(71) Applicant: Robert Bosch GmbH, Stuttgart (DE)

(72) Inventor: Martin Reiche, Weil der Stadt (DE)

(73) Assignee: ROBERT BOSCH GMBH, Stuttgart (DE)

(*) Notice: Subject to any disclaimer, the term of this patent is extended or adjusted under 35 U.S.C. 154(b) by 0 days.

(21) Appl. No.: 14/746,503

(22) Filed: Jun. 22, 2015

(65) Prior Publication Data

US 2015/0373237 A1    Dec. 24, 2015

(30) Foreign Application Priority Data

Jun. 24, 2014   (DE) .................. 10 2014 212 034

(51) Int. Cl.
  *H04N 5/225* (2006.01)

(52) U.S. Cl.
  CPC ......... *H04N 5/2253* (2013.01); *H04N 5/2254* (2013.01); *H01L 2224/48091* (2013.01); *H01L 2224/48472* (2013.01); *H01L 2224/73265* (2013.01); *H01L 2224/8592* (2013.01); *Y02P 70/521* (2015.11); *Y10T 29/49004* (2015.01)

(58) Field of Classification Search
  None
  See application file for complete search history.

(56) References Cited

U.S. PATENT DOCUMENTS

| | | | | |
|---|---|---|---|---|
| 6,573,487 B2* | 6/2003 | Matsumoto | ....... | H01L 27/14625 250/208.1 |
| 7,257,828 B2* | 8/2007 | Ito | ............ | G11B 7/22 720/658 |
| 8,350,202 B2* | 1/2013 | Wang | ........... | G01M 11/0207 250/201.2 |
| 9,185,295 B2* | 11/2015 | Muramatsu | ......... | H04N 5/2253 |
| 9,253,387 B2* | 2/2016 | Furusawa | ............ | G03B 3/04 |
| 9,282,247 B2* | 3/2016 | Park | ............ | G02B 7/08 |
| 9,300,849 B2* | 3/2016 | Lee | ............ | G03B 3/10 |
| 9,319,573 B2* | 4/2016 | Oh | ............ | G02B 7/08 |
| 9,380,212 B2* | 6/2016 | Ahn | ............ | G03B 5/00 |
| 9,386,198 B2* | 7/2016 | Hirota | ............. | H04N 5/2253 |
| 9,386,200 B2* | 7/2016 | Hongo | ............ | H04N 5/2253 |
| 2002/0092967 A1* | 7/2002 | Matsumoto | ....... | H01L 27/14625 250/208.1 |
| 2004/0141452 A1* | 7/2004 | Ito | ............ | G11B 7/22 369/120 |

(Continued)

*Primary Examiner* — Michael Osinski
(74) *Attorney, Agent, or Firm* — Gerard Messina

(57) ABSTRACT

A method for manufacturing an imager module, includes: applying a flexible, in particular elastic, receiving area to a carrier device, for example, a metal plate, and applying an image sensor to the flexible receiving area, the image sensor being tiltable and/or pivotable with the flexible receiving area, attaching a lens, in particular including a guide device, on the image sensor so that the lens aligns the image sensor so that an axis, in particular an optical axis of the lens, extends essentially in parallel to a normal of the image sensor, and fixing the lens on the image sensor and/or the carrier device. The guide device may be formed by three guide pins here, whose lower pin ends define a support plane, which is placed on a sensor surface. In addition, an imager module manufactured in this way is created.

16 Claims, 2 Drawing Sheets

(56) References Cited

U.S. PATENT DOCUMENTS

| | | | | |
|---|---|---|---|---|
| 2006/0038183 A1* | 2/2006 | Oliver | ............... | H01L 27/14618 257/79 |
| 2007/0018309 A1* | 1/2007 | Chang | ................ | H01L 21/6836 257/704 |
| 2007/0253708 A1* | 11/2007 | Watanabe | ............... | G03B 17/00 396/529 |
| 2009/0160998 A1* | 6/2009 | Fukamachi | ............ | G02B 7/021 348/340 |
| 2011/0096419 A1* | 4/2011 | Matsuo | .................... | G02B 7/08 359/820 |
| 2012/0068048 A1* | 3/2012 | Wang | ................. | G01M 11/0207 250/201.2 |
| 2012/0147258 A1* | 6/2012 | Park | ........................ | G02B 7/08 348/374 |
| 2012/0257075 A1* | 10/2012 | Kamada | ............ | H01L 27/14618 348/222.1 |
| 2013/0250170 A1* | 9/2013 | Oh | .......................... | G02B 7/08 348/374 |
| 2013/0258189 A1* | 10/2013 | Lee | ......................... | G03B 3/10 348/374 |
| 2014/0055670 A1* | 2/2014 | Hongo | ................. | H04N 5/2253 348/374 |
| 2014/0218551 A1* | 8/2014 | Muramatsu | .......... | H04N 5/2253 348/208.6 |
| 2014/0362280 A1* | 12/2014 | Tada | ........................ | G02B 7/04 348/357 |
| 2015/0070565 A1* | 3/2015 | Furusawa | ................. | G03B 3/04 348/348 |
| 2016/0014313 A1* | 1/2016 | Muller | ................. | H04N 5/2253 348/294 |

* cited by examiner

METHOD FOR MANUFACTURING AN IMAGER MODULE AND A CORRESPONDING IMAGER MODULE

RELATED APPLICATION INFORMATION

The present application claims priority to and the benefit of German patent application no. 10 2014 212 034.9, which was filed in Germany on Jun. 24, 2014, the disclosure of which is incorporated herein by reference.

FIELD OF THE INVENTION

The present invention relates to a method for manufacturing an imager module and a corresponding imager module.

BACKGROUND INFORMATION

Cameras for motor vehicles generally have an imager module, which is accommodated in a camera housing. The imager module is made up essentially of the image sensor, a carrier device and the lens. The image sensor (imager semiconductor element, imager) may be accommodated in a sensor carrier or mounted directly on a rigid carrier device, in particular a metal plate for good thermal conduction and thus cooling of the image sensor. Such direct mounting of the image sensor on a carrier plate is also known as COB (chip on board).

However, the alignment of the image sensor and the lens is more complex in some cases. The degrees of freedom of the image sensor and of the lens, which is configured as a lens package, i.e., six degrees of freedom, are to be defined for the alignment in general. In an alignment method known as active alignment, the six degrees of freedom are adjusted, and the quality of the alignment in the particular positions is ascertained by detecting a test pattern, for example, and evaluating the image signals of the image sensor by using a modulation transfer function (MTF). The system thereby achieved is subsequently fixed by adhesive bonding, for example.

The optical alignment is thus complex in part. During fixing, care subsequently has to be taken that the achieved alignment is not altered.

SUMMARY OF THE INVENTION

In the method according to the present invention for manufacturing or aligning the imager module, the image sensor is applied adjustably via a flexible receiving area to the carrier device, for example, a metallic carrier plate. The image sensor may thus be pivoted within an adjustment angle range of a few degrees, for example, less than 10°, in particular less than 5°, which may be less than 1°, which may be about two axes. The flexible receiving area may be elastic and may be made of plastic, for example.

The lens is attached rigidly on the image sensor in a joining direction, which corresponds essentially to the axis, in particular the main optical axis of the lens. The lens here is an assembly unit, which has a lens package including optical lenses and a guide device. By attaching and pressing in the joining direction, i.e., perpendicular to the image sensor, the latter may be aligned against the elastic restoring effect of the receiving area. The lens and the image sensor are thus situated together in fixed relative position, so that there are no longer any degrees of freedom of tilting between them. This arrangement may then be fixed.

A few advantages are already achieved in this way:

An automatic alignment of the image sensor with respect to the lens is achieved. This reduces the number of degrees of freedom for the subsequent alignment, so that the subsequent alignment of the imager module is greatly simplified. The number of degrees of freedom in particular may be reduced from six to three.

This also makes it possible to mount the image sensor on a carrier device, which may be metallic, such as a carrier plate, for example, i.e., a COB configuration having good heat dissipation, at low cost and a small installation space.

The automatic alignment takes place by simple attachment, i.e., a joining operation in the joining direction, so that complex tools are not needed for this alignment.

Thus, just two joining partners may be configured, namely the unit composed of the carrier device (metal plate) including a conduction band or other electrical lines, the flexible receiving area and the image sensor, and also the joining partner of the lens package or lens. The relative alignment and thus the reduction of the degrees of freedom are accomplished by simple attachment of the two joining partners. The attached lens may align a normal of the image sensor automatically in such a way that it coincides with the axis of the lens, so that a shared optical axis is formed which may subsequently be aligned.

Attaching the lens package or lens directly on the image sensor also eliminates tolerances, which would be conditional on additional components. The guide device defines a support plane on its underside, which, during attachment on the image sensor, reaches the sensor surface, i.e., the sensitive area or the image plane of the camera. A focusing and alignment may thus also take place in the direction of the optical axis.

The guide device may be formed by three guide pins, for example, whose tips—the lower tips in the joining direction—define the support plane. An accurate and unambiguous definition of the support plane is thus possible since three points define a plane unambiguously. In addition, the guide device may also have a support ring, the underside of which defines the support plane.

The guide device, in particular the guide pins, may already be caulked and machined during production in such a way that the focus of the lens representing a lens package lies in the support plane, i.e., in the plane of the tips of the pins, so that the depth of focus and the z coordinate are set at a suitable object distance, whereby the corresponding object distance is infinite in the case of support at the focal point of the lens package.

As an alternative to a pre-setting of the guide device, the guide device may also be configured to be resilient, so that it is resilient when attached in the joining direction or the vertical direction, i.e., essentially along the optical axis thus formed. For example, the tips of the pins may have a corresponding resilience, to allow a further pressing on focusing after the orthogonal alignment of the imager during the joining operation.

Fixing by adhesive bonding, for example, may subsequently take place.

The present invention is explained in greater detail below on the basis of one specific embodiment in the accompanying drawings.

DETAILED DESCRIPTION

Figure 1:
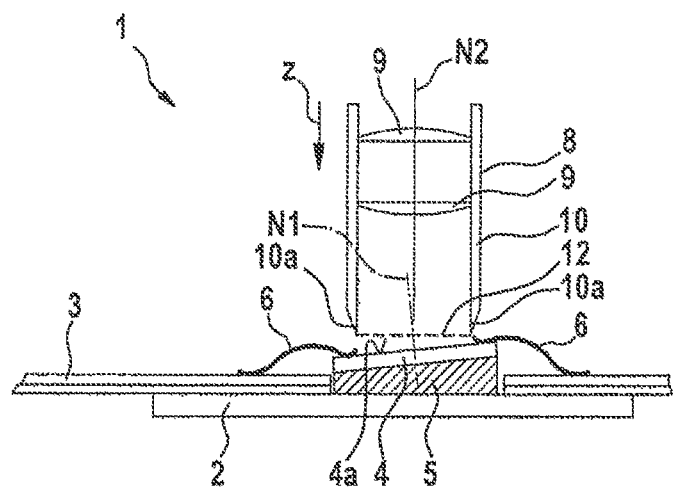
FIG. 1 shows a first task for manufacturing an imager module prior to the attachment of the lens on the carrier device.

An imager module 1 has a metallic carrier plate 2 and a conduction band (flex conductor, flex band) 3 attached to carrier plate 2. A flexible receiving area 5 made of a flexible elastic material, for example, a flexible plastic, is applied to carrier plate 2. An image sensor 4 (imager chip, imager semiconductor component) is attached on receiving area 5 and contacted with flexible conduction band 3 via wire bonds 6.

Receiving area 5 may be made of a material having a good thermal conductivity to permit a good heat dissipation from image sensor 4 to metallic carrier plate 2. This material may contain silicone or a siloxane, for example. In addition, it may also contain silver, for example.

This assembly unit or this joining partner is thus manufactured by applying a flexible elastic receiving area 5 to carrier plate 2, attaching image sensor 4 on receiving area 5, fastening conduction band 3 on carrier plate 2 and contacting image sensor 4 with conduction band 3 via wire bonds 6; wire bonds 6 are subsequently accommodated in a flexible casting compound 7, shown at the left in FIG. 2, to be able to absorb the mechanical loads of the alignment, or casting compound 7 is applied after the alignment.

A lens 8 (lens unit, lens package) is used as a separate unit and includes one or multiple lenses 9 and advantageously at least three guide pins 10 having pin tips 10a. Guide pins 10 may be configured as part of the lens frame holding lenses 9 or in addition to a lens frame, for example. Image sensor 4 is secured in its orientation and position by its normal N1, which is perpendicular, i.e., normal, to sensor surface 4a of image sensor 4. Lens 8 is defined by its axis N2. To adjust imager module 1, axis N2 and normal N1 should coincide and form a shared optical axis A. For this purpose, the correct lateral position of lens 8 should be found first, which may be accomplished by a tool during the joining. In addition, the suitable orientation, i.e., the parallel alignment of N2 and N1, is to be achieved. For this purpose, pin tips 10a are configured with sufficient accuracy in such a way that support plane 12 (shown with a dashed line in FIG. 1), defined by pin tips 10a, is perpendicular to axis N2.

In FIG. 1, image sensor 4 initially has a different orientation in relation to axis N2, the representation in FIG. 1 for illustration having a very great misalignment. There is an initial misalignment of less than/equal to approximately 1° between N2 and N1. According to FIG. 1, lens 8 is still not in a fixed relationship to the joining partner of carrier plate 2 and image sensor 4.

Figure 2:
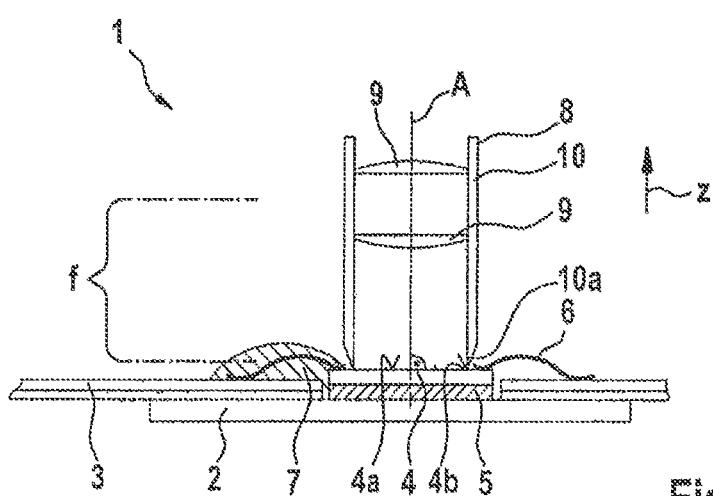
FIG. 2 shows the imager module configured subsequently.

According to FIG. 2, lens 8 is positioned in joining direction z, i.e., the vertical direction, from above, in such a way that guide pins 10 reach image sensor 4 with their pin tips 10a and press the image sensor downward. The support plane 12 defined by pin tips 10a thus rests on sensor surface 4a of image sensor 4. Image sensor 4 is thus pressed into the same orientation as lens 8. Normal N1 of image sensor 4 and axis N2 coincide and together form optical axis A of imager module 1.

A correct lateral position of lens 8 and also an adjustment with respect to the relative tilt angles between lens 8 and image sensor 4 are thus achieved automatically.

The adjustment in the vertical direction, i.e., the z direction, i.e., parallel to optical axis A, corresponds to the focusing. On the one hand, focus f of lens 8 may be put into support plane 12 already during the manufacture of lens 8, so that a focusing of the entire system is already achieved here. In the subsequent placement of lens 8 with pin tips 10a and thus support plane 12 on imager module 1, an optical focusing on the infinite object distance, for example, is achievable. A different distance in the z direction may also be selected for object distances different from this. Such a configuration may be achieved, for example, in the production of lens 8 and the lens holder by caulking or machining of guide pins 10.

As an alternative to that, there may also be a focusing according to FIG. 2, in that guide pins 10 have a sufficient resilience or flexibility, to permit deformation, in particular of pin tips 10a, after the orthogonal alignment of image sensor 4 in a subsequent step and thus to permit focusing by deformation and pressing.

In this specific embodiment, three guide pins 10 are advantageously provided as the guide device since three guide pins unambiguously define precisely one plane with their pin tips 10a. In addition, a support ring, whose underside forms support plane 12, may also be provided as the guide device.

Pin tips 10a of guide pins 10 or another guide device lie on upper side 4a of image sensor 4 outside its sensitive area 4b (optically active zone) and outside the contacting areas, which may be bond lands 4c, for receiving wire bonds 6.

According to one embodiment, flexible receiving area 5 may be made of a uniform material, for example, a material containing silicone and/or siloxane and/or also a silver compound. In addition, the material of flexible receiving area 5 may also have a thermally curing component, which allows a post-fixing.

According to an alternative embodiment, flexible receiving area 5 is not configured to be uniform but instead has area-sections, for example, annular area-sections having different properties. For example, one area-section, such as an annular area, may be elastically deformable for alignment, and another area-section, e.g., an annular area, may be plastically deformable with subsequent curing, for example, thermal curing by heating.

During the manufacture of lens 8 or the lens package, alignment of support plane 12 perpendicular to axis N2 of lens 8 or the lens package is achieved by hot caulking of a plastic part, for example. For this purpose, for example, a hot mold having a flat surface may be moved perpendicular to axis N2 and pin tips 10a may be deformed in such a way that they accurately define support plane 12 perpendicular to axis N2.

Thus, with the imager module according to FIG. 2, only the three shared angles of optical axis A of imager module 1 in the camera are to be defined.

Figure 3:
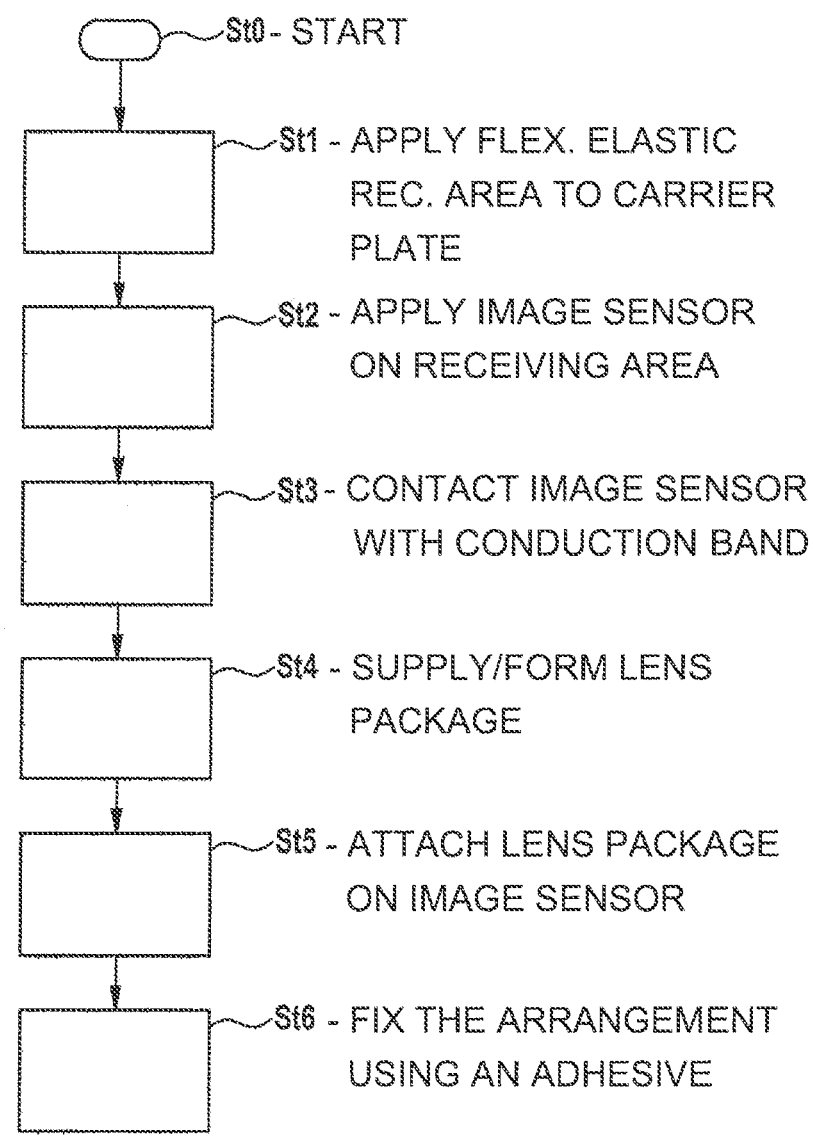
FIG. 3 shows a flow chart of a manufacturing method according to one specific embodiment.

The method according to the present invention thus includes the following steps according to the flow chart of FIG. 3, after the start in step St0:

Step St1: applying a flexible elastic receiving area 5 to metallic carrier plate 2, Step St2: applying, in particular attaching, image sensor 4 on receiving area 5, Step St3: contacting image sensor 4 with conduction band 3, which may be with supplementary application of an elastic casting compound 7;

Step St4: supplying or forming a joining partner, such as lens 8 (lens package) including lenses 9, lens frame and guide device 10, for example, having three guide pins 10, whereby the lens frame and guide device 10 may be configured in one piece;

Step St5: attaching lens 8 on image sensor 4, an optical alignment taking place automatically and shared optical axis A is formed, and Step St6: fixing the arrangement, for example, by using an adhesive.

Step St1 and St2 here may also be interchanged, so that image sensor 4 is initially attached on flexible receiving area 5, and this unit is subsequently attached on carrier plate 2. In addition, the joining partners are manufactured independently of one another, so that step St4 may also take place prior to step St1, for example.

What is claimed is:

1. A method for manufacturing an imager module, the method comprising:

applying a flexible receiving area to a carrier device and applying an image sensor to the flexible receiving area, the image sensor being at least one of tiltable and pivotable with the aid of the flexible receiving area;

attaching a lens unit, having a lens, on the image sensor so that the lens unit aligns the image sensor so that an axis, which is an optical axis of the lens, extends essentially in parallel to a normal of the image sensor; and fixing the lens unit on at least one of the image sensor and the carrier device.

2. The method of claim 1, further comprising:

contacting, prior to attaching the lens unit, the image sensor with a conduction device.

3. The method of claim 1, wherein the alignment of the image sensor occurs by attaching the lens unit in a joining direction in parallel to the axis of the lens.

4. The method of claim 1, wherein the image sensor on the flexible receiving area is at least one of pivotable and tiltable about two different pivot axes extending in the sensor surface.

5. The method of claim 1, wherein the flexible receiving area is elastic, and the image sensor is aligned against an elastic restoring force of the receiving area.

6. The method of claim 1, wherein a support plane is defined on a front end of the lens unit in the joining direction, this support plane reaching a sensor surface and/or coinciding therewith, of the image sensor when the lens is attached.

7. The method of claim 6, wherein the lens unit has a guide device, which forms the support plane on the front end in the joining direction.

8. The method of claim 7, wherein the guide device is formed by three guide pins, their forward ends each having a pin end, which is set on the sensor surface of the image sensor, the three pin ends defining the support plane.

9. The method of claim 8, wherein a focusing occurs by deformation of the pin ends of the guide pins by pressing them in the joining direction, whereby image signals of the image sensor are evaluated.

10. The method of claim 1, wherein, prior to the attachment of the lens unit on the image sensor, a length of a guide device is preset to adjust a focus and subsequently the guide device is attached on the lens unit without being deformed.

11. The method of claim 1, wherein after the fixing, an optical unit, formed from the lens unit and the image sensor, is aligned with its optical axis having three degrees of freedom or coordinates.

12. An imager module for a camera, comprising:

a carrier device;

a conduction device;

an image sensor, which is contacted with the conduction device; and a lens unit;

wherein an optical axis of the imager module is defined by the image sensor and the lens unit, wherein a flexible or resilient receiving area is provided between the image sensor and the carrier device, wherein the image sensor is tiltable or adjustable on the receiving area, and wherein the lens unit is rigidly connected to the image sensor.

13. The imager module of claim 12, wherein the lens unit includes a guide device, which rests rigidly on the image sensor or a device rigidly connected to the image sensor.

14. The imager module of claim 12, wherein the receiving area is elastic.

15. The imager module of claim 12, wherein the guide device rests on a sensor surface of the image sensor outside a sensitive area and outside contacting areas.

16. The imager module of claim 12, wherein the guide device rests on a sensor surface of the image sensor outside a sensitive area and outside contacting areas, which include bond lands.

* * * * *